US007649200B1

(12) United States Patent  
Miller et al.

(10) Patent No.: US 7,649,200 B1
(45) Date of Patent: Jan. 19, 2010

(54) SYSTEM AND METHOD OF DETECTING IC DIE CRACKS

(75) Inventors: Roy Mark Miller, Austin, TX (US); Seth J. Prejean, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 420 days.

(21) Appl. No.: 11/133,108

(22) Filed: May 19, 2005

Related U.S. Application Data

(63) Continuation of application No. 11/121,641, filed on May 4, 2005, now abandoned.

(51) Int. Cl.
*H01L 23/58* (2006.01)

(52) U.S. Cl. .................. 257/48; 257/415; 257/528; 257/536; 257/E21.521; 438/18

(58) Field of Classification Search .......... 257/48, 257/E21.521
See application file for complete search history.

(56) References Cited

U.S. PATENT DOCUMENTS 5,723,875 A * 3/1998 Abe et al. ............... 257/48
5,751,015 A * 5/1998 Corbett et al. ............ 257/48
6,094,144 A * 7/2000 Dishongh et al. ......... 340/653
6,449,748 B1  9/2002 Jeng et al.
6,649,986 B1 * 11/2003 Ishizaki et al. .......... 257/415
6,686,750 B2 * 2/2004 Watanabe et al. ........ 324/691
7,141,990 B2 * 11/2006 Bast et al. ............... 324/708
7,185,295 B2 * 2/2007 Park et al. ................ 716/4
7,247,921 B2 * 7/2007 Sugiura et al. .......... 257/494

FOREIGN PATENT DOCUMENTS

JP            406244254 A  *  9/1994

* cited by examiner

*Primary Examiner*—Charles D. Garber
*Assistant Examiner*—Angel Roman
(74) *Attorney, Agent, or Firm*—Foley & Lardner LLP

(57) ABSTRACT

A structure and method is utilized to detect cracks, fissures, fractures, or other dislocations in an IC die. A conductive line in a metal layer is provided about the periphery of the IC die. A break in the conductive line indicates that the IC die is cracked. A JTAG interface can be utilized to provide an indication of whether the die is cracked.

15 Claims, 6 Drawing Sheets

SYSTEM AND METHOD OF DETECTING IC DIE CRACKS

CROSS-REFERENCE TO RELATED PATENT APPLICATIONS

This application is a Continuation of U.S. application Ser. No. 11/121,641, filed May 4, 2005, incorporated herein by reference in its entirety.

FIELD OF THE INVENTION

The present invention relates to integrated circuits (IC). More specifically, the present invention relates to a structure for and method of testing for cracks, fissures, fractures, dislocations, delamination, etc. in an IC.

BACKGROUND OF THE INVENTION

Integrated circuits ("ICs") are typically formed on a wafer of semiconductor material that is subsequently cut into individual dies. The individual dies, or chips, contain millions of individual elements (e.g. transistors, gates, pastors, diodes, resistors, etc.). While individually these solid-state elements are typically highly reliable, each with a failure rate on the order of one in one trillion devices, the entire chip can fail due to the formation of cracks, fissures, fractures, delaminations, or other dislocations in the IC die. Advanced ICs which utilize a larger number of layers and generate more heat are even more susceptible to die crack or delamination problems.

Detecting cracks and their cause is important to IC fabricators because cracking frequently results in an inoperable IC device. IC fabricators desire to detect cracks as early in the fabrication process as possible so additional process steps are not performed and so corrective actions can be taken at the appropriate process steps to prevent the die cracks.

IC devices that have cracked dies are often returned and the IC fabricator must determine the cause of the crack to determine if it is due to inappropriate customer usage. Diagnosing cracks early allows the fabricator to determine if the crack occurred before delivery to customer and to identify whether the customer is inadvertently causing damage to the IC die.

Heretofore, die cracks have been detected by determining whether a failure of the chip has occurred, and if such a failure has occurred, optically inspecting the IC die for a crack or other defect. Optical detection is a time-consuming process and can require that the die be depackaged or otherwise uncovered to view whether a crack is present. The die crack problems can result in a number of failure modes for the IC device. The cause of the die cracks is often difficult to determine without expensive optical analysis on a large number of failed units. This analysis requires a large amount of time and integrated circuit yields and qualities can suffer while the cause of the die crack problem is being diagnosed.

FIG. 1 of U.S. Pat. No. 6,449,748 shows an example of an implementation of guard rings used to detect die crack problems. The guard rings are provided on test dies. Guard rings are generally composed of conductive lines, usually metal, which are formed in one or more layers of test die. A disconnective segment of the guard ring indicates a crack in that region of the die.

U.S. Pat. No. 6,449,748 notes that it is impracticable to place guard rings in actual chips which are produced and sold to customers (production chips) due to the amount of space required on chip and additional processing for this additional circuitry. According to U.S. Pat. No. 6,449,748, such guard rings are not useful in identifying die cracks in production chips, especially in production chips in which the die crack problem develops later in the process.

Microprocessors manufactured by Advanced Micro Devices, Inc. of Sunnyvale, Calif., such as the K7 microprocessor, have included a die crack detection chain. The chain runs the length of the L2 side of the die. The L2 side of the die is more vulnerable to cracks than other parts of the die. The chain one failure signature reliably indicates the presence of cracks on the L2 side of the die which has no input/output circuitry. However, the chain cannot detect cracks that occur on other portions of the die.

In addition, IC dies can be subject to delaminations. Delaminations occur when neighboring layers separate or pull apart from each other. Metal layers are particularly susceptible to delamination problems. Delamination can cause a disconnection between neighboring metal layers which results in an IC device failure. As the metal layers are separated from each other due to delamination, conductive vias in the neighboring layers no longer contact the conductive lines above or below them. Heretofore, delaminations have been difficult to detect.

Therefore, there is a need for a structure for and a method of detecting cracks and/or delamination in a production chip. Further still, there is a need for a structure for and a method of detecting cracks across an entire IC die and/or delaminations in the IC die. Yet further, there is a need for a structure for and method of quickly diagnosing chip cracks and/or delaminations and using that data to derive corrective actions. Yet even further, there is a need for and a method of detecting a crack across the entire periphery of the IC die or delaminations in a metal layer of the IC die. Yet further, there is a need for a circuit that can diagnose the mechanical health of the IC die.

SUMMARY OF THE INVENTION

An exemplary embodiment relates to an IC die. The IC die includes a substrate, and a metal layer above the substrate. The metal layer includes a conductive line having a path about the periphery of the IC die.

Another exemplary embodiment relates to a system for detecting cracks in an IC die. The system includes a conductive line means provided along the periphery of the IC die for breaking when the IC die is cracked, and means for determining a break in the conductive line means.

Still another exemplary embodiment relates to a method of detecting a crack in an IC die. The method includes supplying an electrical potential to a conductive line, about a periphery of the die, and determining if the line is broken. The conductive line is disposed about a periphery of the die.

BRIEF DESCRIPTION OF THE DRAWINGS

Exemplary embodiments will hereafter be described with reference to the accompanying drawings, wherein like numerals denote like elements.

DETAILED DESCRIPTION OF THE PREFERRED EMBODIMENTS

Figure 1:
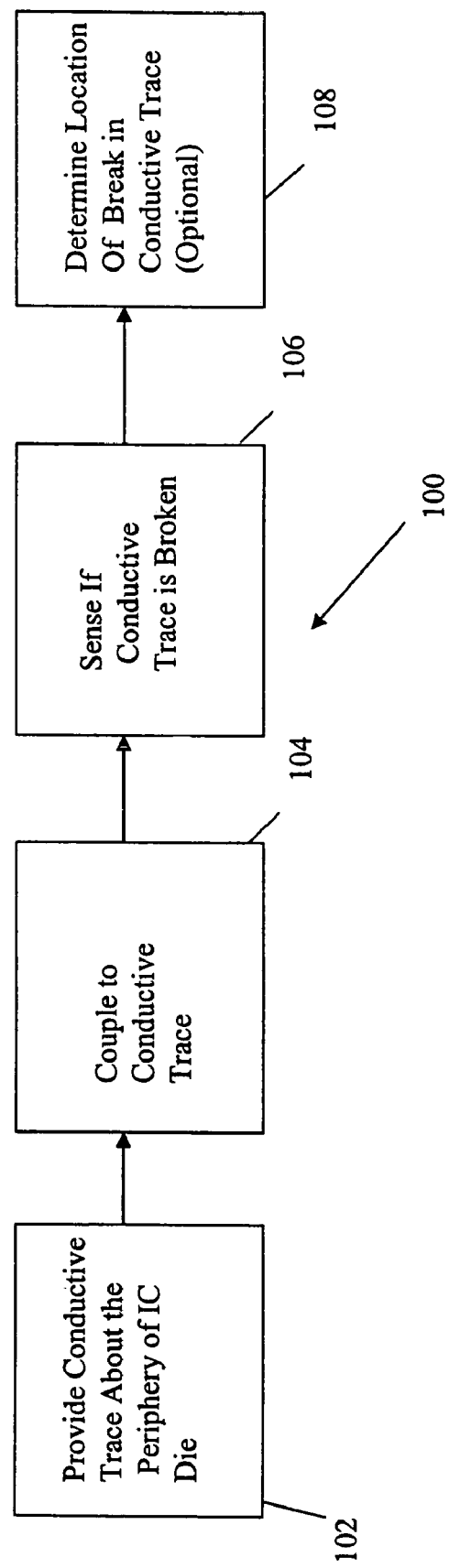
FIG. 1 is a general flow diagram showing a process for determining the existence of cracks and/or delaminations on an IC die in accordance with an exemplary embodiment.

With reference to FIG. 1, a process 100 is utilized to detect whether a crack and/or delaminations is present on IC die. In step 102, a conductive trace or wire is provided about the periphery of an IC die. Preferably, the trace follows a square or rectangular perimeter of the die. The trace is a small wire preferably about substantially the entire periphery of the die at its outermost limit of the design rules.

The conductive path about the periphery is generally the most vulnerable to any cracks propagating along the saw line associated with the cutting of the IC wafer from which the IC device is manufactured. The conductive trace can be provided through any metal layer and can be on multiple metal layers. Preferably, even if the trace extends through multiple metal layers, it is preferably always the outermost conductive line. The trace can also have truncated corners and preferably avoids the die seal associated with the chip.

At a step 104, a test probe, or other device is coupled to the conductive trace. Alternatively, the conductive trace can be fixedly or programmably coupled to an I/O pin or solder bump for external connections. In another embodiment, the conductive trace is coupled to test circuit integrated within the IC.

At a step 106, a circuit is used to sense if the conductive trace is broken. If the conductive trace is broken, the IC die is likely to have a crack, dislocation, fissure, or other fracture. If an internal test circuit is utilized, the test result can be stored in a register for subsequent provision external to the IC.

Generally, any crack that propagates in die 8 and crosses conductive trace 18 creates a break or opening in trace 18. Similarly, a delamination that crosses the conductive line or trace 18 as it passes through multiple layers creates a break or opening in trace 18. Testing trace 18 for an open circuit diagnoses the break. The test method can be done using a simple electrical test through IC automated test equipment (ATE) or even with basic lab instruments (e.g., voltage, amperage, and/or resistance meters).

At a step 108, the location of the delamination and/or crack can be determined. A voltage and current measurement scheme can allow diagnosis of the location of the crack/delamination if a resistor network is utilized with a conductive trace. Further, physical and/or optical analysis of the conductive trace can also assist in determining the location of the crack and/or delamination. The diagnosis of the physical location of the crack provides easier failure analysis in finding the root cause. For example, the location of the crack does not require that the entire chip be scanned optically to analyze the crack. As explained below with reference to FIG. 5, resistors can be attached or coupled to conductive line 18 and various spots to assist in determining location of failures.

Advantageously, process 100 provides a fast and easy way to electrically test and diagnose devices that have cracks in the silicon die or delaminations in metal layers. Process 100 can be implemented in any VSLI design.

Figure 2:
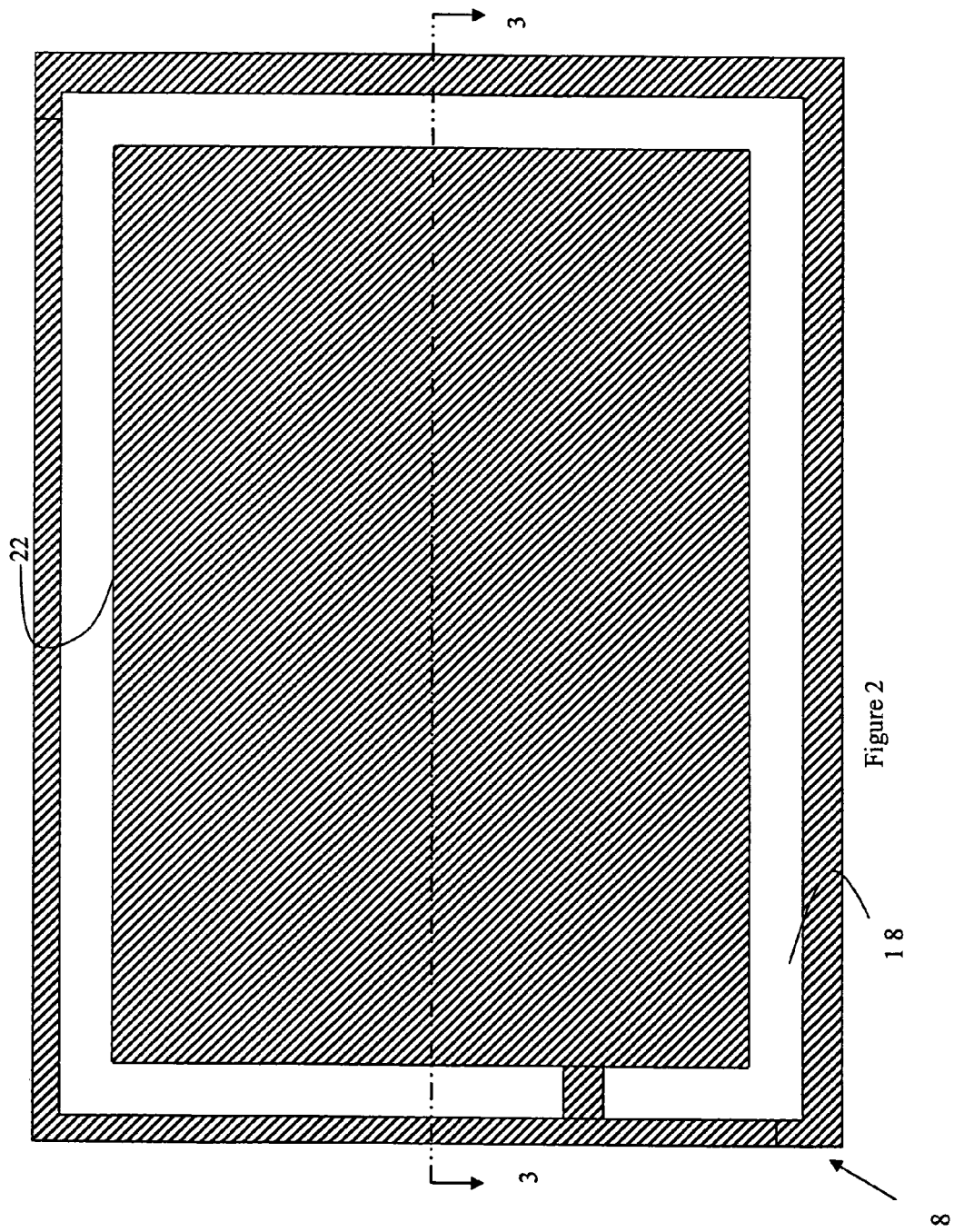
FIG. 2 is a general schematic top view drawing of an IC die in accordance with an other exemplary.
Figure 3:
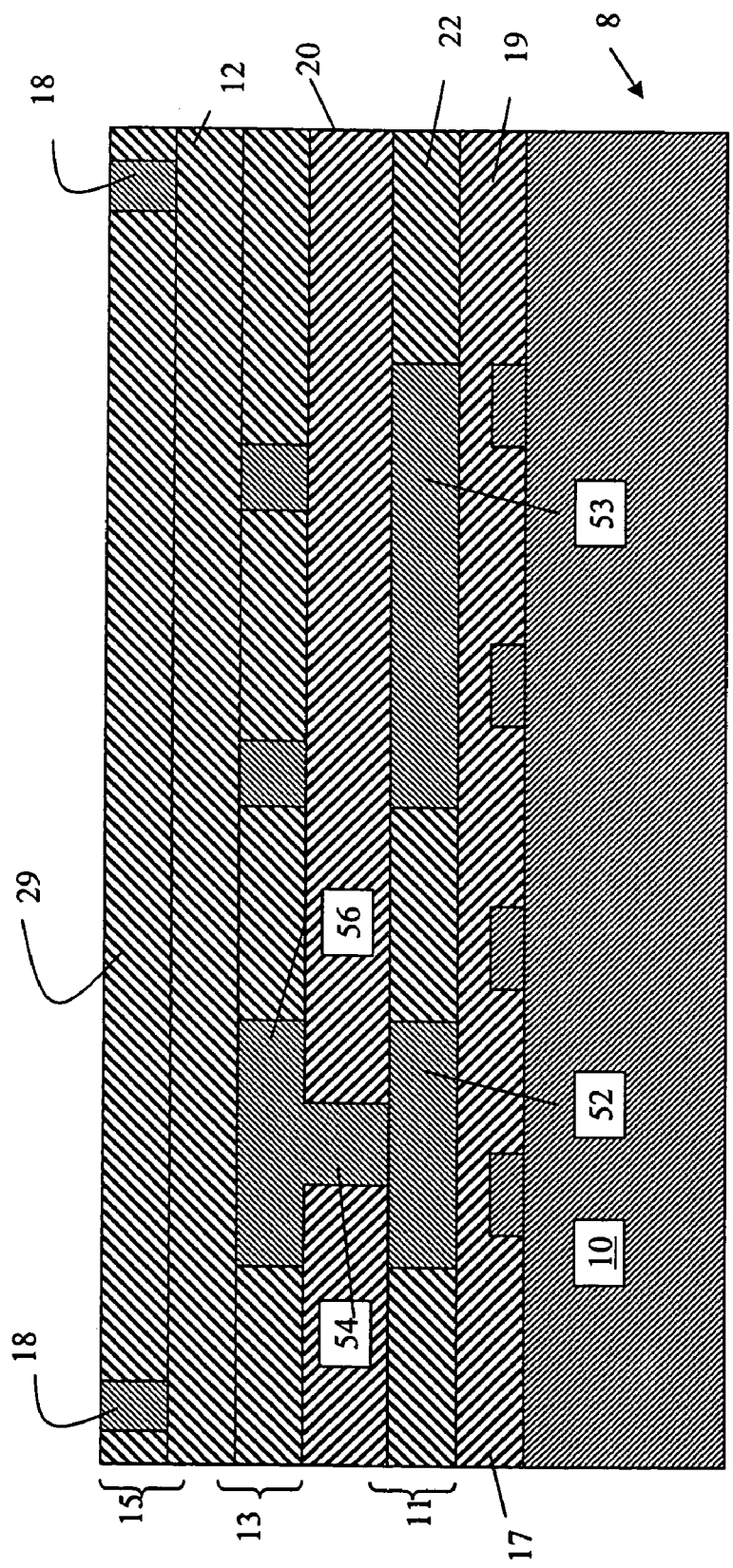
FIG. 3 is a general schematic cross sectional view drawing of the IC die illustrated in FIG. 2 about line 3-3.

With reference to FIGS. 2 and 3, process 100 can be utilized to determine a crack in an IC die 8. In FIGS. 2 and 3, die 18 is shown without the last metal layer as the top layer for simplicity. IC die 8 includes a device (transistor) layer 17 above a substrate 10. Device layer 17 includes a dielectric layer 19. Process 100 can be performed before or after die 18 is packaged, planarized, etc.

Metal layers 11, 13, and 15 are provided above dielectric layer 19. Metal layers 11 and 13 are coupled together by a conductive via 56. In one embodiment, conductive line 56 of metal layer 13 is coupled to conductive line 52 of metal layer 11 by via 54. Metal layer 11 includes interlevel dielectric 22. Metal layers 11 and 13 can contain numerous other vias and conductive lines.

Conductive line 18 preferably extends around the entire periphery of IC die 8. Conductive line 18 is provided in a dielectric layer 19. Conductive trace 18 can be aluminum, copper, or other material associated with IC metal layers. Preferably, trace or line 18 is a simple metal layer that only runs around substantially the entire periphery of die 8 at the outermost limits of design rules. In this way, conductive line 18 is more vulnerable to cracks propagating from the saw line. Layer 18 can run up and down through any metal layers (e.g., layers 11 and 13) particularly if needed to avoid circuitry in metal layer 15 or if needed to test die 8 for delaminations. Circuitry for IC die 8 can be provided within the perimeter of line 18.

Although FIG. 3 shows a three layer metal device, the present invention is not limited to a three layer device. Conductive line 18 can be implemented in multiple metal layers including in an eleven layer or more device. Particular details in FIGS. 2 and 3 are not shown in a limiting fashion unless such features are specifically recited in the claims.

Figure 4:
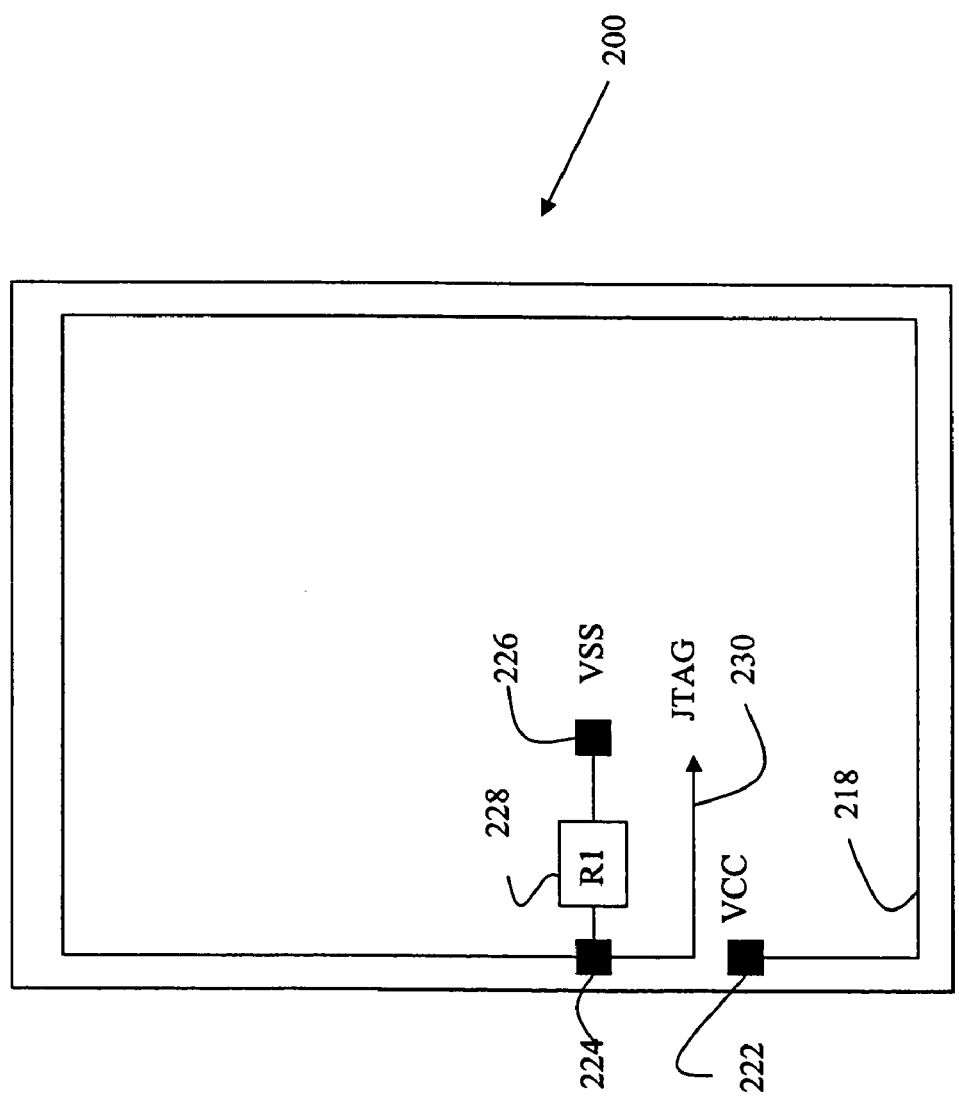
FIG. 4 is a general electrical schematic diagram showing a circuit for detecting cracks and/or delaminations in an IC die in accordance with yet another exemplary embodiment.

With reference to FIG. 4, conductive trace 218 is similar to conductive trace 18 and extends about a periphery of an IC die 200. Conductive trace 218 is coupled to a VCC (or VDD) power node 222 and is coupled to a J-tag interface 230. J-tag interface 230 allows monitoring via J-tag register. For example, interface 230 could be coupled to a free bit on a J-tag register such as test mode configure, STPC, or other bit. Preferably, a pull-up resistor 228 is provided between a ground or VSS node 226 and a node 224. When IC 200 has a crack, conductive line 218 is broken and a low signal is provided at output to J-tag interface 230. Alternatively, node 226 can be a power node and node 222 can be a ground node.

Preferably, power to conductive trace 218 can be internally removed to reduce power consumption outside of a test mode. According to another embodiment, resistor 228 and VSS node 226 can be external to die 200 and connection can be made via at least one solder bump or one attached to a conductive trace 218 that is floating.

Figure 5:
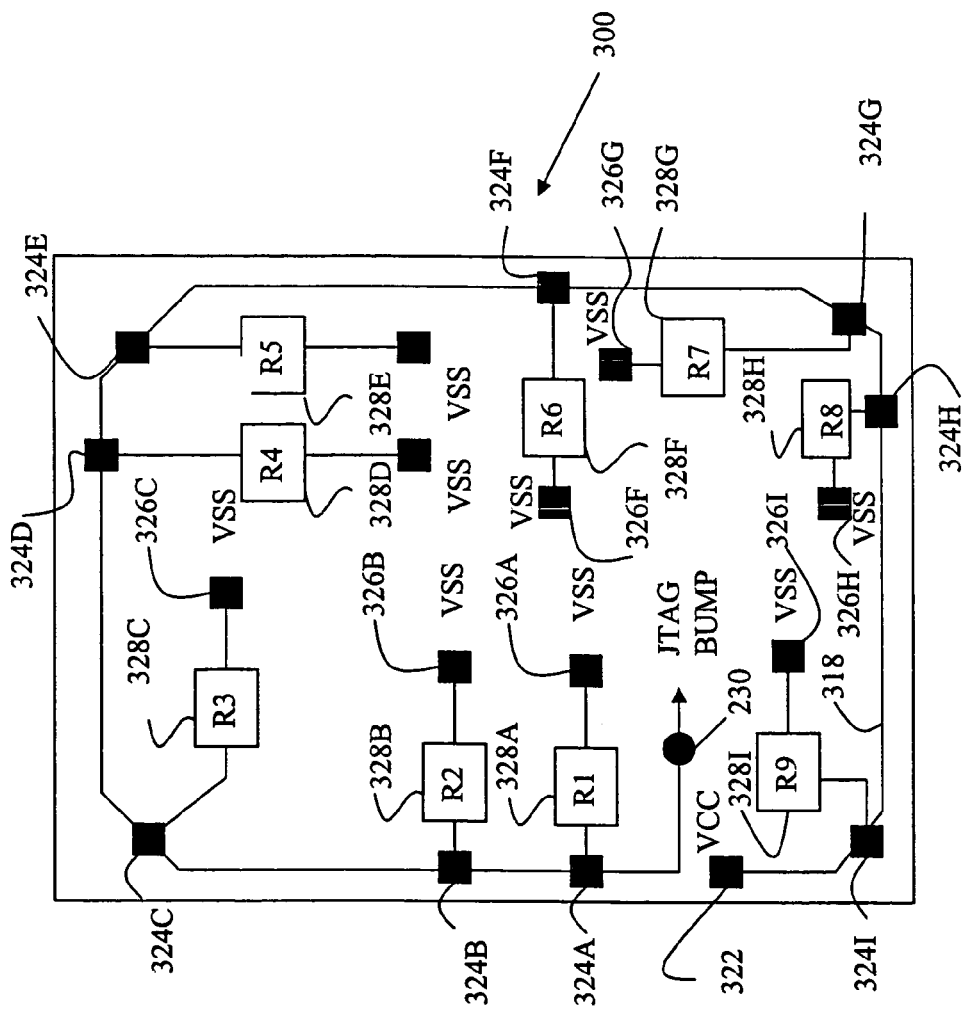
FIG. 5 is a general electrical schematic diagram showing another circuit for determining cracks and/or delaminations in accordance with yet another exemplary embodiment.

With reference to FIG. 5, IC die 300 includes 9 resistors 328A-I at different locations along conductive line 318. Conductive line 318 is similar to conductive trace 218 (FIG. 4). Resistors 328A-I are coupled between nodes 324A-I and VSS nodes 326A-I, respectively. Values for resistors 328A-I are chosen according to resistance values for trace segments between nodes 324A-I on conductive line 318. The use of appropriate resistance allows the location of a crack to be determined based upon either voltage, resistance, or current measurements or a combination thereof. For example, a powered voltage measurement between VSS and node 230 can indicate whether the die is cracked or not. The value of a non-powered resistance measurement between VSS and node 230 indicates approximately where the die crack resides.

As shown in FIG. 5, resistors 328A-I each have a one end coupled at nodes 324A-I (various locations of conductive line 318) and another end coupled to VSS nodes 328A-I, respectively. Alternatively, rather than using a solder bump, node 230 can be an external IO circuit for providing signals external to the chip. In one embodiment, node 230 can be a solder bump reserved for die crack sensing.

Conductive line 318 preferably has truncated corners associated with corners of IC die 300. For example, nodes 318C, 324E, 324G, and 324I are at a portion of conductive trace 318 which is at a 45 degree angle with respect to the sides of IC die 300.

Figure 6:
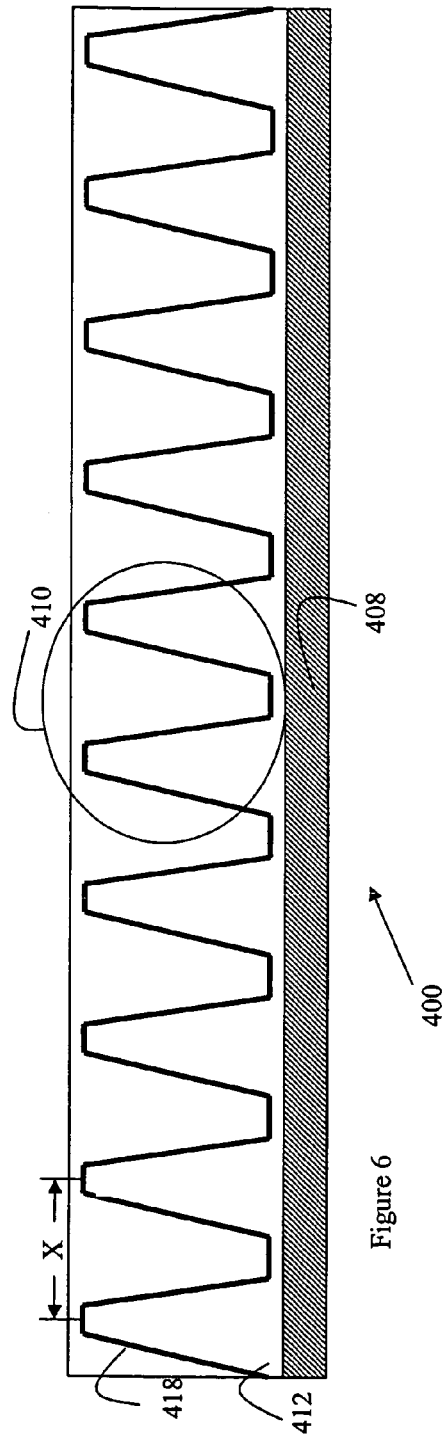
FIG. 6 is a general schematic drawing of a cross sectional view of an IC die in accordance with still another embodiment.
Figure 7:
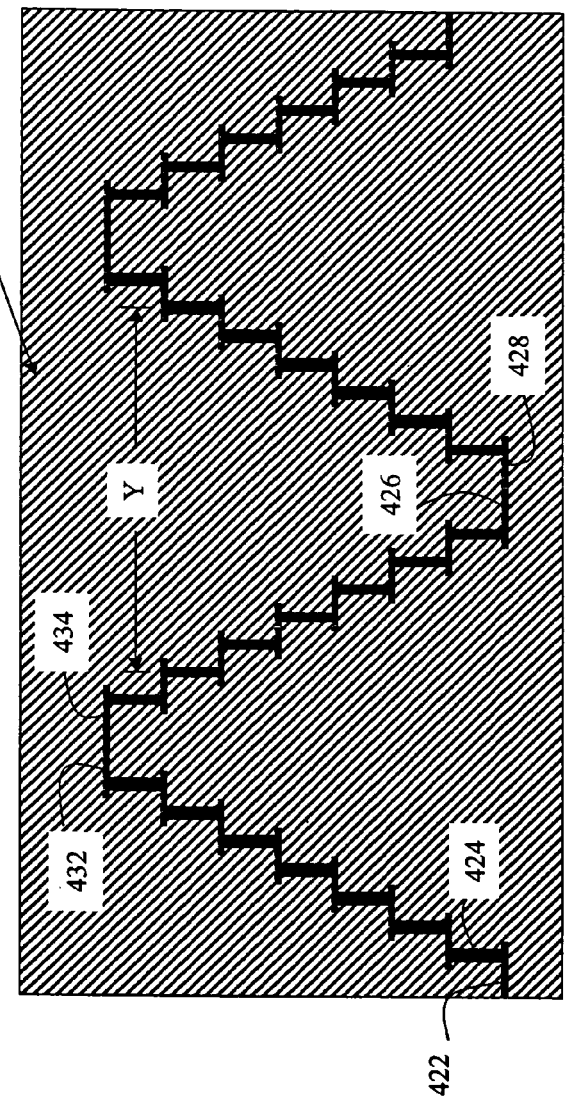
FIG. 7 is a more detailed cross-sectional schematic drawing of a portion of the IC die illustrated in FIG. 6.

With reference to FIGS. 6 and 7, die 400 includes a conductive trace or line 418 for sensing cracks and delaminations. Line 418 is similar to line 318. In FIG. 6, conductive line 418 runs from left to right. Conductive line 418 is provided in metal layers 412 above substrate 408. A portion 410 of conductive line 418 is shown in more detail in FIG. 7.

Conductive line 418 preferably has a step or trapezoidal cross section extending into each of metal layers 412. Such an orientation allows delaminations to be sensed such that dislocation between a via such as via 424 and a conductive line such as line 422 can be sensed. Preferably, spacing design rules require that X be at least 75 micrometers so that the top metal layer (such as a metal layer 11) can be utilized and yet not interfere with die seal connectivity to VSS nodes.

In another preferred embodiment, the dimension X is less than 100 micrometers to provide best coverage from M1 to M11 for distance along the die perimeter. In one embodiment, 22 equally spaced segments are provided per X. Each segment is spaced approximately 3.5 to 4 micrometers between overlap. Overlap can be determined by contact spacing design rules.

In one embodiment, the top metal layer (metal layer 11) has double length segments 432 and 434 and the bottom metal layer (metal layer 11) has double length segments as shown by segments 426 and 428. The pattern of portion 410 is preferably repeated about the perimeter of IC die 400.

Conductive line 422 is preferably a bottom most metal layer. The dimension Y in FIG. 7 is preferably at least 75 micrometers. Dimension Y is between conductive lines in the second most upper layer.

It is understood that while the detailed drawings come with specific examples, material types, thicknesses, dimensions, and particular values given provided a preferred exemplary embodiment of the present invention, the preferred exemplary embodiment was for the purpose of illustration only. The method and apparatus of the invention is not limited to the precise details and conditions disclosed. For example, although specific types of configurations of the conductive line are shown, other configurations can be utilized. Various changes may be made to the details disclosed without the party from the spirit of the invention which is defined by the following claims.

What is claimed is:

1. An IC die comprising:
   a substrate;
   a metal layer above the substrate, the metal layer including a conductive line having a path about the periphery of the IC die, wherein the conductive line includes a first end having a first node and a second end having a second node;
   a first resistor electrically coupled between a first location on the conductive line and a third node; and
   a second resistor electrically coupled between a second location on the conductive line and the third node, wherein the first location and the second location are positioned on different sides of the IC die, wherein a resistance across the second node and the third node determines an approximate location of a break in the conductive line as a result of a crack in the IC die.

2. The IC die of claim 1, wherein the conductive line is the outer most conductive line in the metal layer.

3. The IC die of claim 2, wherein the conductive line is the outer most conductive line on the IC die.

4. The IC die of claim 1, wherein the first node is electrically coupled to power and the third node is electrically coupled to ground.

5. The IC die of claim 1, wherein the conductive line is coupled to a JTAG interface comprising a JTAG register, wherein the JTAG register is formed on the IC die.

6. The IC die of claim 1, further comprising a third through ninth resistor electrically coupled between a third through ninth location, respectively, and the third node, wherein the third through ninth locations are distributed along the conductive line.

7. The IC die of claim 1, wherein a third, fourth or fifth metal layer conductive line is within a die seal.

8. The IC die of claim 1, wherein the conductive line includes at least three metal layers of alternating metal trace segments electrically connected by vias to form the conductive line having the path about the periphery of the IC die, wherein the alternating metal trace segments form a periodic pattern having a trapezoidal cross section, wherein the distance between center points of metal trace segments in a top metal layer is less than 100 micrometers.

9. The IC die of claim 1, wherein the conductive line has a rectangular path with truncated corners.

10. An IC die comprising:
    a substrate; and
    a conductive line about a periphery of the IC die and above the substrate including at least three metal layers of alternating metal trace segments electrically connected by vias to form the conductive line about the periphery of the IC die, wherein the alternating metal trace segments form a periodic pattern having a trapezoidal cross section, wherein the distance between center points of metal trace segments in a top metal layer is less than 100 micrometers.

11. The IC die of claim 10, wherein the IC die is configured to provide an electric potential from within the IC die to the conductive line to determine if the conductive line is broken.

12. The IC die of claim 11, wherein the electric potential is VCC.

13. The IC die of claim 11, further comprising:
    a JTAG interface.

14. The IC die of claim 10, wherein a location of the crack is determined by determining a location of a break in the conductive line, wherein the conductive line has a first end and a second end.

15. The IC die of claim 14, further comprising:
    a plurality of resistors each having a known resistance value, wherein each of the plurality of resistors is electrically coupled between a node and the conductive line, wherein each of the plurality of resistors is electrically coupled to a different location on the conductive line to form a plurality of line segments between resistors, wherein the location of the break in the conductive line is determined by measuring the resistance between the node and the second end of the conductive line.

* * * * *

UNITED STATES PATENT AND TRADEMARK OFFICE
CERTIFICATE OF CORRECTION

PATENT NO. : 7,649,200 B1 Page 1 of 1
APPLICATION NO. : 11/133108
DATED : January 19, 2010
INVENTOR(S) : Miller et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 587 days.

Signed and Sealed this

Twenty-third Day of November, 2010

David J. Kappos
*Director of the United States Patent and Trademark Office*